(12) United States Patent
Hosokawa (10) Patent No.: US 7,876,575 B2
(45) Date of Patent: Jan. 25, 2011

(54) SUBSTRATE HOUSING CONTAINER (75) Inventor: Kohei Hosokawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 390 days.

(21) Appl. No.: 12/147,045

(22) Filed: Jun. 26, 2008

(65) Prior Publication Data

US 2009/0002966 A1    Jan. 1, 2009

(30) Foreign Application Priority Data

Jun. 27, 2007    (JP) .............................. 2007-169248

(51) Int. Cl.
*H05K 7/18* (2006.01)
*H05K 7/14* (2006.01)

(52) U.S. Cl. .................. 361/797; 361/796; 361/756; 361/802; 206/707; 206/710; 206/706; 206/711; 211/41.17; 211/41.18

(58) Field of Classification Search ................. 361/727, 361/741, 756, 759, 796, 797, 801, 802; 206/706, 206/707, 708, 710, 711; 211/41.17, 41.18
See application file for complete search history.

(56) References Cited

U.S. PATENT DOCUMENTS

| | | | | |
|---|---|---|---|---|
| 3,915,307 A | * | 10/1975 | Agarde | 211/41.17 |
| 4,061,228 A | * | 12/1977 | Johnson | 206/454 |
| 4,427,114 A | * | 1/1984 | Howell et al. | 206/707 |
| 4,478,331 A | * | 10/1984 | Ruin | 206/707 |
| 4,527,222 A | * | 7/1985 | Swingley, Jr. | 361/797 |
| 5,201,415 A | * | 4/1993 | Metz | 206/707 |
| 5,706,946 A | * | 1/1998 | Kakizaki et al. | 206/454 |
| 5,735,407 A | * | 4/1998 | Kallio | 206/707 |
| 5,782,361 A | * | 7/1998 | Kakizaki et al. | 206/711 |
| 6,120,116 A | * | 9/2000 | Phillips | 312/223.2 |
| 7,400,510 B1 | * | 7/2008 | Milligan et al. | 361/752 |
| 7,559,730 B2 | * | 7/2009 | Song | 414/217 |
| 2008/0257779 A1 | * | 10/2008 | Kurikawa | 206/707 |

* cited by examiner

*Primary Examiner*—Dameon E Levi
(74) *Attorney, Agent, or Firm*—Sughrue Mion, PLLC (57) ABSTRACT

The present invention includes a ceiling portion 8, bottom portion 9, a substrate housing portion 3 formed by a side walls 5 to 7, a plurality of wafer slots 11 arrayed in parallel on the inner surface of the side walls 6 and 7, a slit portion 12 formed in an extended manner along the array direction of the wafer slots 11 on each of a second side wall 6 and a third side wall 7, a slide portion 18 movably arrayed along each of the slit portions 12, a plurality of substrate securing pieces arrayed with substantially the same intervals with the intervals of the wafer slots 11 on the inner surface of the slide portion 18, in which, with the slide portion being in a substrate securing position, the substrate housing pieces press and secure the substrate on the wafer slot 11, and in a substrate securing releasing position, the substrate housing pieces move separately from a circumferential portion of the substrate and releases a securing state of the substrate. In accordance with the present invention, it is possible to provide a substrate housing container which is able to hold the wafer in a predetermined position even in a case in which the substrate housing container is moved in which a lid body is released.

10 Claims, 12 Drawing Sheets

SLIDING DIRECTION

FIG. 3B

SLIDING DIRECTION

SUBSTRATE HOUSING CONTAINER

BACKGROUND OF THE INVENTION

1. Field of the Invention

The present invention relates to a substrate housing container that is used for housing, storing, and transporting or the like of a semiconductor wafer, a glass wafer, or the like.

Priority is claimed on Japanese Patent Application No. 2007-169248, filed on Jun. 27, 2007, the content of which is incorporated herein by reference.

2. Description of the Related Art

Generally, a semiconductor wafer, a glass wafer, or the like is housed or transported in a state where a plurality thereof is housed in a substrate housing container. (Please refer Patent Documents 1 to 3.) In the substrate housing container for housing wafers, it is necessary to support the plurality of wafers which are housed with predetermined intervals so that the wafers do not touch with each other. For this reason, a wafer slot, for supporting the plurality of wafers with the predetermined intervals, is provided, and a substrate securing jig, for holding the wafers supported by the wafer slot as it is, is provided.

For example, in Patent Document 1, as a container main body for housing the semiconductor wafer, a structure provided with a ditch plank for supporting the semiconductor wafer from both sides is disclosed. In Patent Document 2, a structure provided with a ditch plank supporting member for supporting the plurality of wafers inside of the container main body is disclosed. In Patent Document 3, a substrate housing container of a front open box type, provided with rear retainers having a plurality of ditches on both left and right sides of the container, is disclosed, and a structure, for horizontally supporting the semiconductor wafer by fitting the semiconductor wafer between the rear retainers of left and right sides, is disclosed.

An example of the conventional substrate housing container as configured above is shown in FIG. 15.

The substrate housing container is provided with a main case 101, a front side of which is opened, a lid body 102 for opening and closing the front side of the main case which is opened.

Figure 15A:
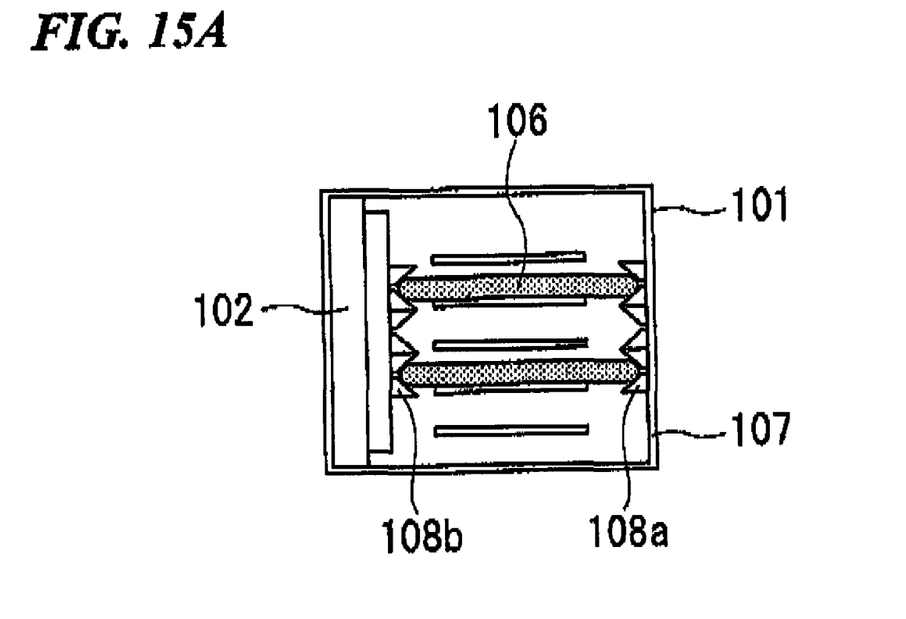
FIG. 15 is a schematic view showing an example of a conventional substrate housing container.
Figure 15B:
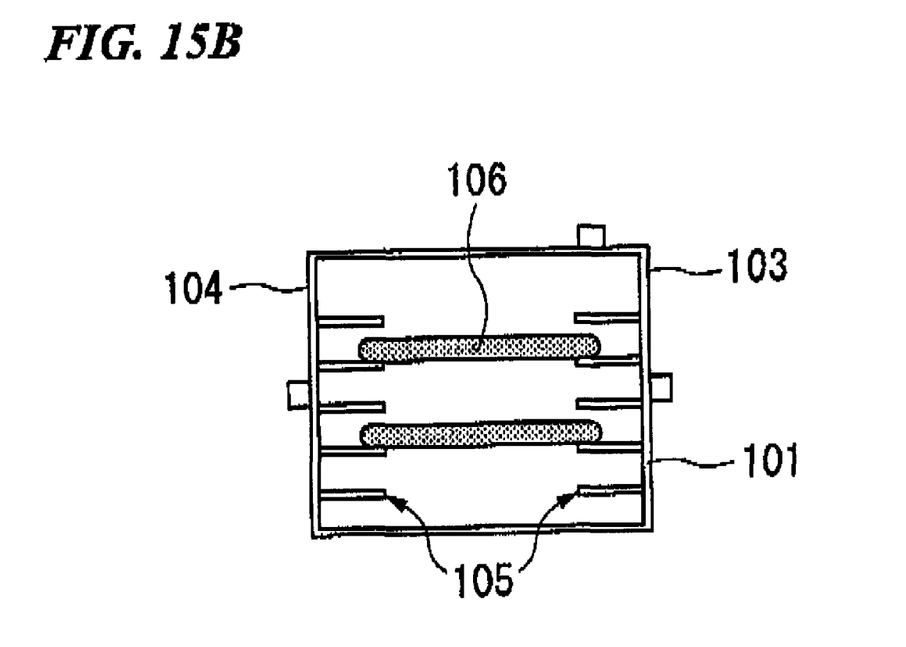

As shown in FIG. 15B, in the main case 101, a plurality of wafer slots 105 is arrayed in the vertical direction with predetermined intervals on the inner surface of side wall portions 103, 104 which are facing each other. Wafers 106 are housed one by one between each pair of the wafer slots 105 arrayed in the vertical direction. The wafers 106 are supported by and bridge the pair of wafer slots 105 located below against the gravitational direction.

As shown in FIG. 15A, on the inner surface of a side wall portion 107 facing the front side of the main case 101, a plurality of substrate securing jigs 108a for engaging with a circumferential portion of the wafer 106, which is supported on the wafer slot 105, is arrayed. On the side of the main case 101 of the lid body 102, a plurality of substrate securing jigs 108b for engaging with a circumferential portion of the wafer 106, which is supported on the wafer slot 105, is arrayed. The wafer 106 housed in the main case 101 is secured to a predetermined position (a state supported by a wafer slot 105) in the main case 101 by being clipped with the substrate securing jig 108a provided on the side wall portion 107 and the substrate securing jig 108b provided on the lid body 102 in a state where the lid body 102 is installed onto main case 101. Accordingly, even when the substrate housing container is subject to vibration during transportation or the like, the wafer 106 is held on the wafer slot 105 and so damages to wafer 106 by, for example, the wafers 106 touch each other or the wafer 106 touches the inner surface of the main case 101, are prevented.

Patent Document 1: Japanese Unexamined Patent Application, First Publication No. 2004-214269
Patent Document 2: Japanese Unexamined Patent Application, First Publication No. 2004-247467
Patent Document 3: Japanese Unexamined Patent Application, First Publication No. 2005-005525

However, with the substrate housing container as described above, when the lid body 102 is installed on the main case 101, the wafer 106 is secured on the wafer slot 105 as described above. When the lid body 102 is released, the wafer 106 is clipped with the substrate securing jig 108a and the substrate securing jig 108b is released, so a state in which the wafer 106 is placed and not secured on the wafer slot 105 is obtained. For this reason, there has been such problems, for example when the lid body is released and the substrate housing container is transported, or operations such as wafers being taken out or brought in to the substrate housing container are performed, the wafer 106 is moved from above the wafer slot 105 and touches another wafer 106 or a wall surface or the like of the main case 101 which leads to the damage or breakage of wafers 106.

This problem becomes a similar concern in the structure disclosed in Patent Document 1. That is, since the wafer is not secured when the lid is released, when the wafer is taken out manually in a state where the main case is inclined; there is a concern that the wafer might touch other members and be damaged due to unexpected movements of the wafer.

The present invention was achieved in view of the above circumstances, and has as its main object to provide a substrate housing container which can hold the wafer in the predetermined position even when the substrate housing container is moved in a state where the lid is released.

SUMMARY OF THE INVENTION

In order to solve the above mentioned problems, a substrate housing container in accordance with the present invention includes a substrate housing portion of chassis shaped having a ceiling portion, a bottom portion, and a plurality of side wall portions; a plurality of supporting plates arrayed with intervals between main surfaces from the side of the ceiling portion to the side of the bottom portion on the inner surface of the pair of side wall portions which configures the substrate housing portion; slit portions formed in each of the pair of side wall portions in an extended manner along the array direction of the supporting plates; a slide portion movably arrayed in the slit portions and an edge portion of which is protruded from at least the ceiling portion or the bottom portion; and a substrate securing piece parallely arrayed with substantially the same intervals as the intervals of the supporting plates on the inner surface of the slide portion; in which a substrate housed in the substrate housing portion is freely placed between the supporting plate provided on one of the pair of side wall portions and the other of the pair of the side wall portions as if bridged therebetween; the substrate is freely secured on the supporting plates with the substrate securing piece abutting the circumferential portion of the substrate in a state in which one end portion of the slide portion is protruded from the bottom portion, and a substrate securing state is freely released with the substrate securing piece moving apart from the circumferential portion of the substrate in which the other end portion of the side portion is protruded from the ceiling portion.

With this constitution, in a state in which the lid body is released, it is possible to secure the substrate on the supporting plate or to release a state in which the substrate is secured by slicing the slide portion in the vertical direction. In a state in which the substrate is secured on the supporting plate, even when the lid body is not installed and motions such as movement or vibration are operated, the substrate is held on the supporting plate. Therefore, it is possible to prevent damage or breakage of the substrate by touching other substrates, wall surface, or the like. Since it is possible to easily release the secured substrate by operating the slide of the slide portion, it is possible to easily move from a state in which the substrate is secured, to an operation for taking out and bringing in the substrate.

In the present invention, an upper flange portion located in the outer side of the substrate housing container may be provided on the edge portion on the side of the ceiling portion of the slide portion so that the downward movement of the slide portion is restrained in a state in which the upper flange portion abuts the ceiling portion.

In accordance with the constitution, it is possible to prevent the slide portion from falling off of the opening on the side of the bottom portion of the slit portion.

In the present invention, the substrate securing piece may be freely secured with the substrate securing piece abutting the circumferential portion of the substrate and pressing the substrate to the supporting plate in which the upper flange portion abuts the ceiling portion.

In accordance with the constitution, it is possible to control the position of the slide portion in which the substrate securing piece abutting the circumferential portion of the substrate.

In the present invention, a lower flange portion located in the outer side of the substrate housing container in the edge portion of the side of the bottom portion of the slide portion may be provided so that the upward movement of the slide portion may be restrained and the lower flange portion may abut the bottom portion.

In accordance with the constitution, it is possible to prevent the slide portion from falling off of the opening on the side of the ceiling portion of the slit portion.

In the present invention, the substrate securing piece may move separately from the circumferential portion of the substrate and the securing state of the substrate may be freely releasable and the lower flange portion may abut the bottom portion.

In accordance with the constitution, it is possible to control the position of the slide portion so that the substrate securing piece is separated from the circumferential portion of the substrate.

In the present invention, a gasket may be provided at least in either a surface facing the bottom portion of the lower flange portion or a surface facing the lower flange portion of the bottom portion In accordance with the constitution, it is possible to prevent foreign materials such as dust from entering from a gap between the slit portion and the slide portion and to prevent the substrate housing portion from being polluted.

In the present invention, a stopper may be provided for securing the slide portion so that the upper flange portion may abut the ceiling portion and/or the lower flange portion may abut the side of the bottom portion.

In accordance with the constitution, it is possible to secure the position of the slide portion in so that the substrate securing piece may abut the circumferential portion of the substrate and/or so that the substrate securing piece may be apart from the circumferential portion of the substrate.

In the present invention, when the upper flange portion of the slide portion protrudes from the ceiling portion, the stopper may be freely inserted between the upper flange portion and the ceiling portion, and the slide portion may be freely and temporaly secured by the stopper.

In accordance with the constitution, it is possible to secure the position of the slide portion so that the substrate securing piece abuts the circumferential portion of the substrate with a simple structure.

In the present invention, a protection cover for covering the upper edge portion of the slide portion and the upper flange portion may be provided in the ceiling portion.

In accordance with the constitution, it is possible to prevent foreign materials such as dust from entering from a gap in the slide portion and to prevent the substrate housing portion from being polluted.

In the present invention, on a surface of one side of an outer side case, an opening is provided, and the outer side case has a lid body for opening and closing the opening. A plurality of substrate securing jigs for engaging with the circumferential portion of the substrate placed on the supporting plates may be placed on the inner surface of the side wall portion facing the opening and the surface on the side of the outer side case of the lid body with substantially the same intervals as the supporting plates. When the opening is in a state of being closed by the lid body, the substrate may be clipped with the substrate securing jig provided on the side wall portion and the substrate securing jig provided on the lid body and may be secured on the supporting plate.

In accordance with the constitution, it is possible to secure the substrate placed on the supporting plate on the supporting plate when the lid body is installed.

In accordance with the present invention, by sliding the slide portion vertically when the lid body is released, it is possible to secure the substrate on the supporting plate or to release the substrate from being secured. In the state in which the substrate is secured on the supporting plate, even when the operations such as movement or vibration are performed and the lid body is not installed, the substrate is secured on the supporting plate and so it is possible to prevent the breakage of the substrate by touching other substrates, or wall surfaces or the like. Since the state in which the substrate is secured can be easily released, it is possible to easily move from the state in which the substrate is secured to the operation of taking out and bringing in the substrates.

DETAILED DESCRIPTION OF THE INVENTION

Figure 1:
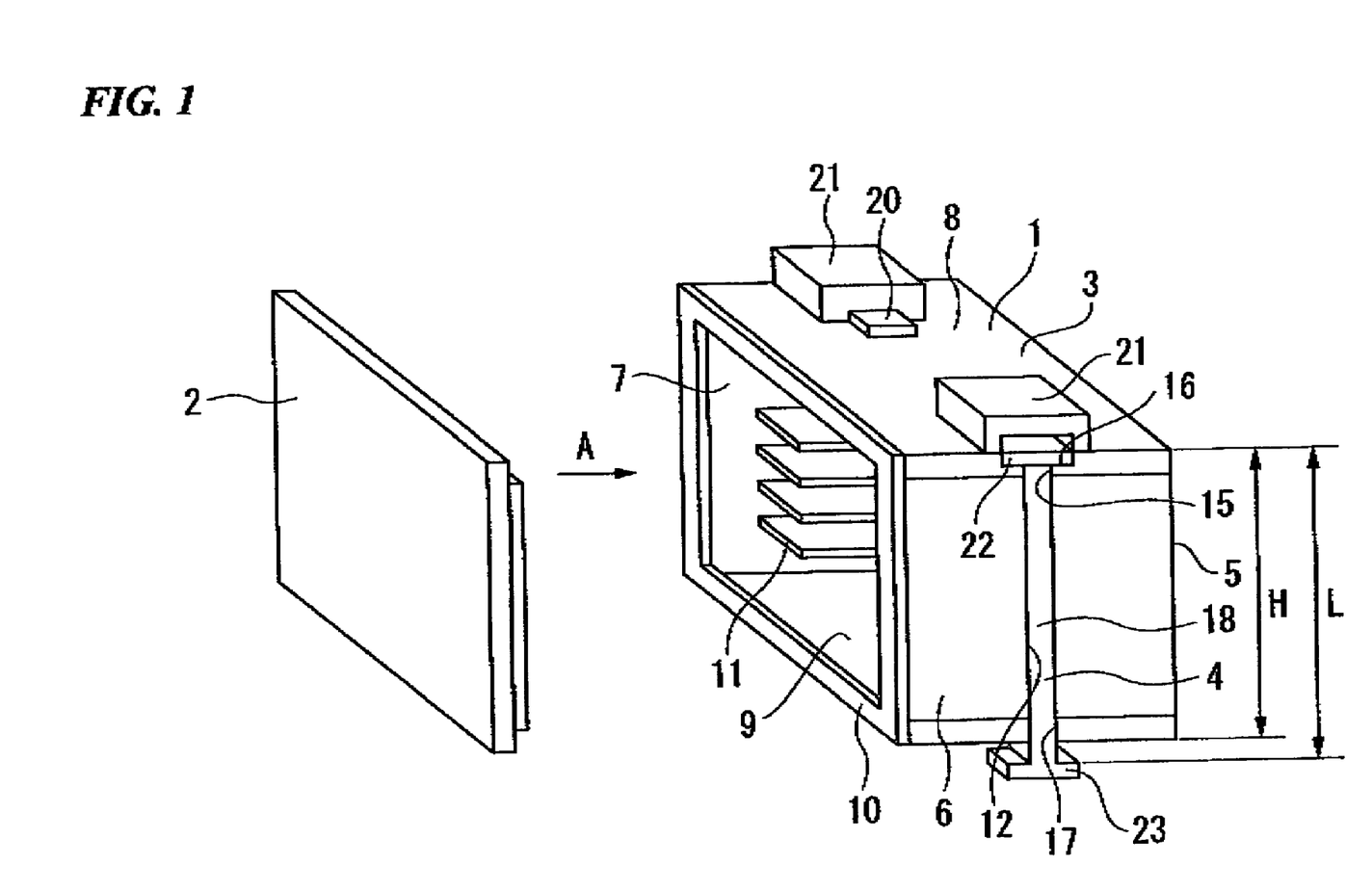
FIG. 1 is a perspective view showing an embodiment of a substrate housing container of the present invention.
Figure 2A:
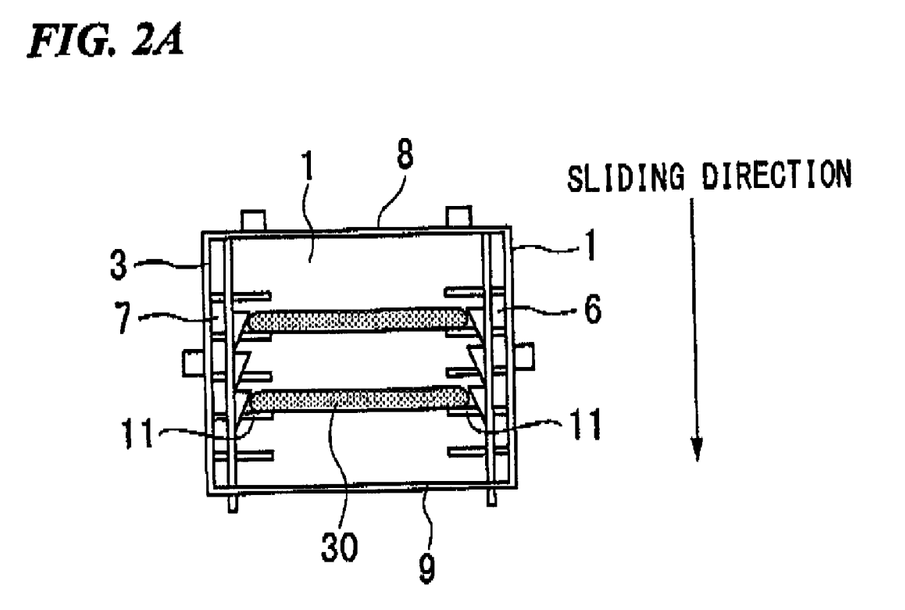
FIG. 2 is a schematic view showing a state in which a slide portion is located in a substrate securing position in the substrate housing container of FIG. 1.
Figure 2B:
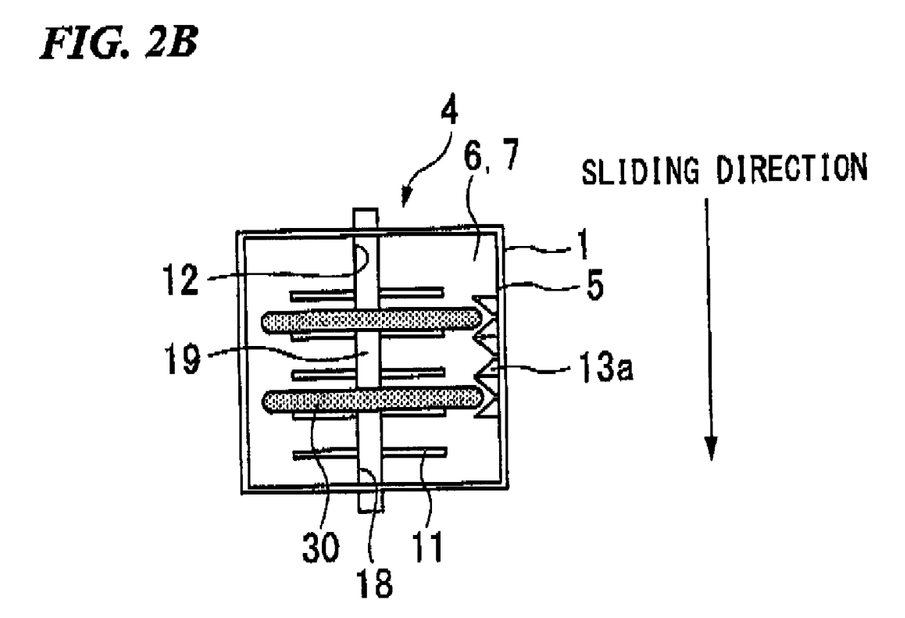
Figure 3A:
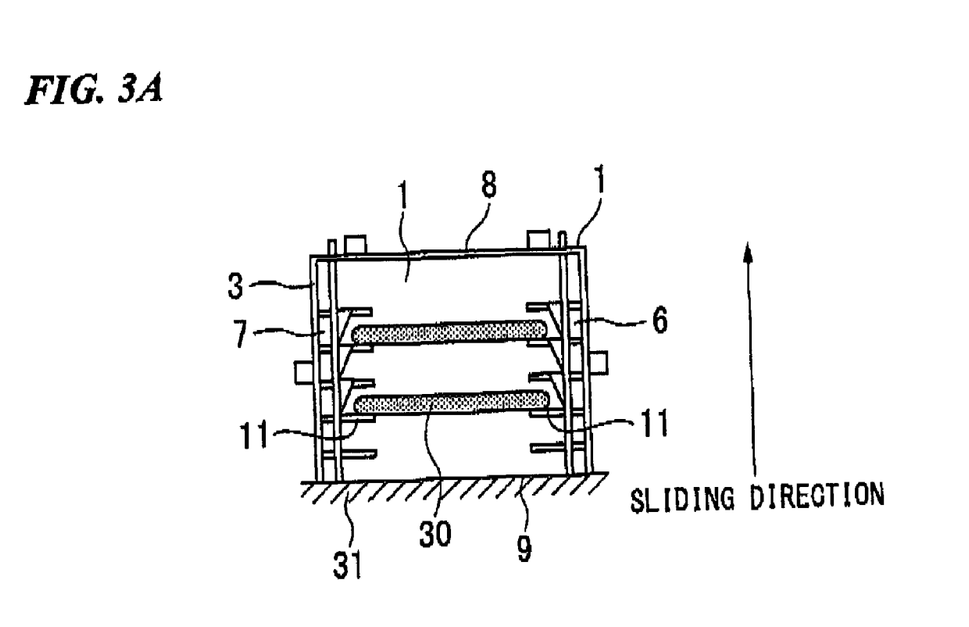
FIG. 3 is a schematic view showing a state in which a slide portion is located in a substrate securing releasing position in the substrate housing container of FIG. 1.
Figure 3B:
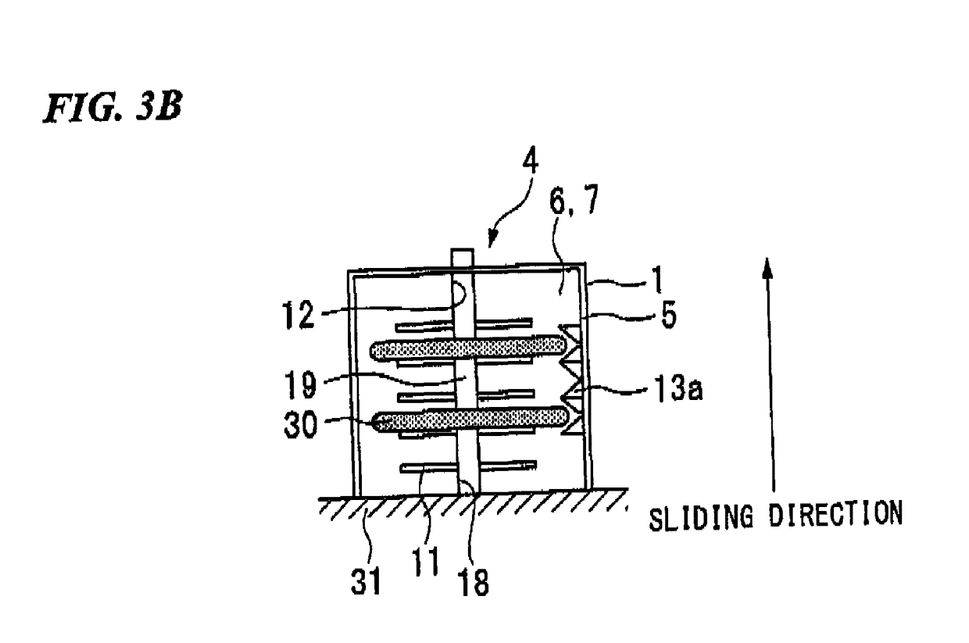
Figure 4A:
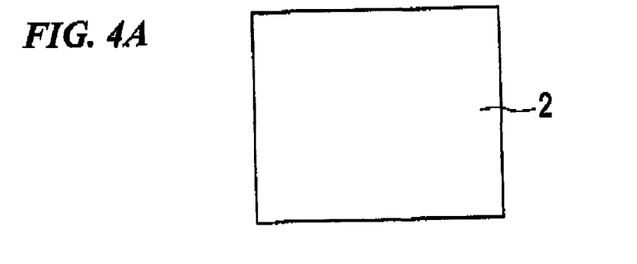
FIG. 4 is a schematic view showing a lid body provided in the substrate housing container of FIG. 1.
Figure 4B:
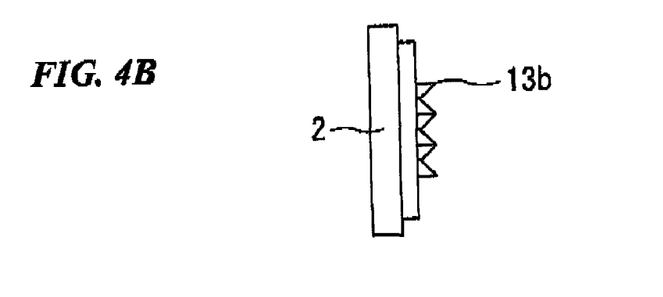
Figure 5A:
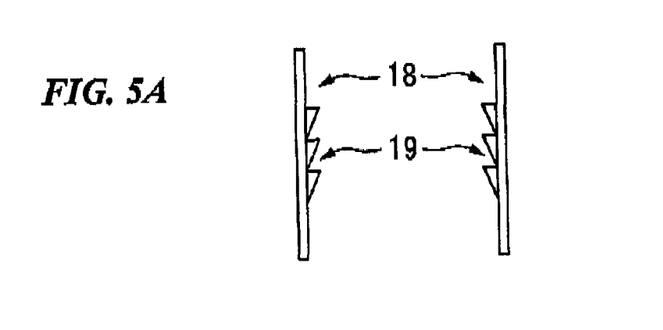
FIG. 5 is a schematic view showing a slide portion provided in the substrate housing container of FIG. 1.
Figure 5B:
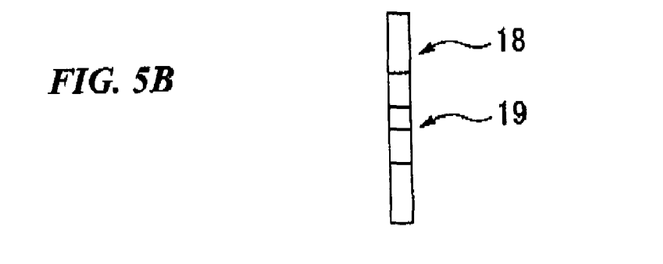
Figure 6:
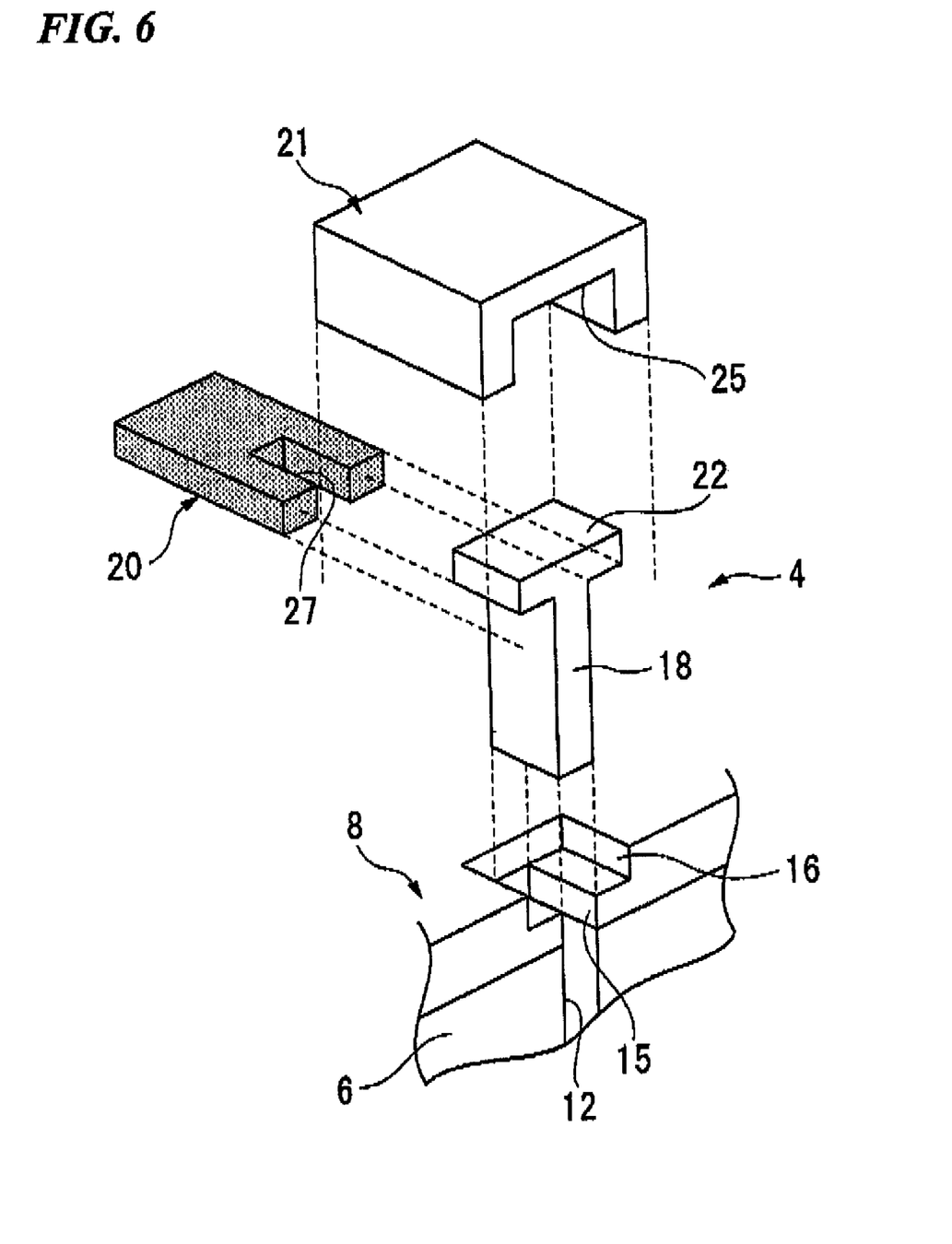
FIG. 6 is an exploded perspective view showing an upper side of a substrate securing mechanism provided in the substrate housing container of FIG. 1.
Figure 7:
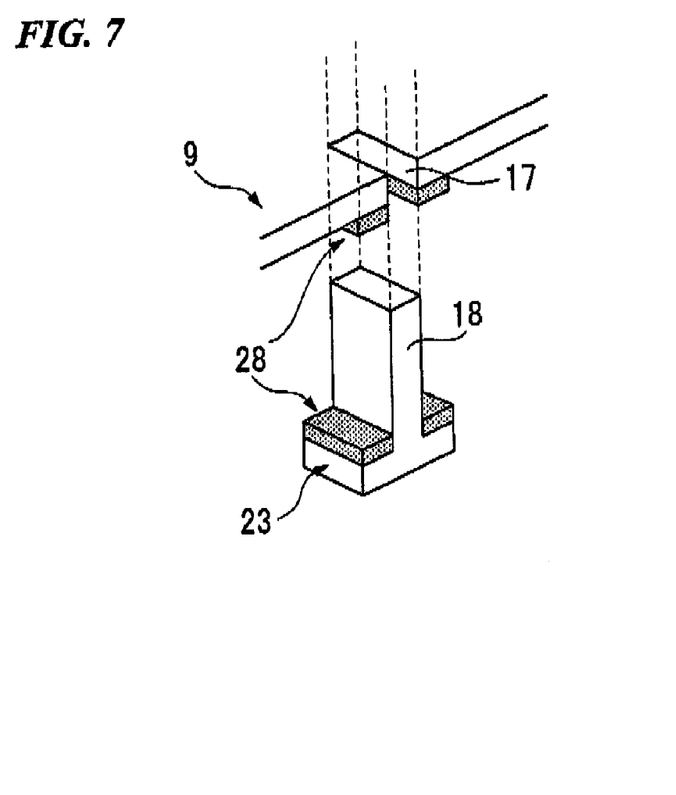
FIG. 7 is an exploded perspective view showing a lower side of a substrate securing mechanism provided in the substrate housing container of FIG. 1.
Figure 8:
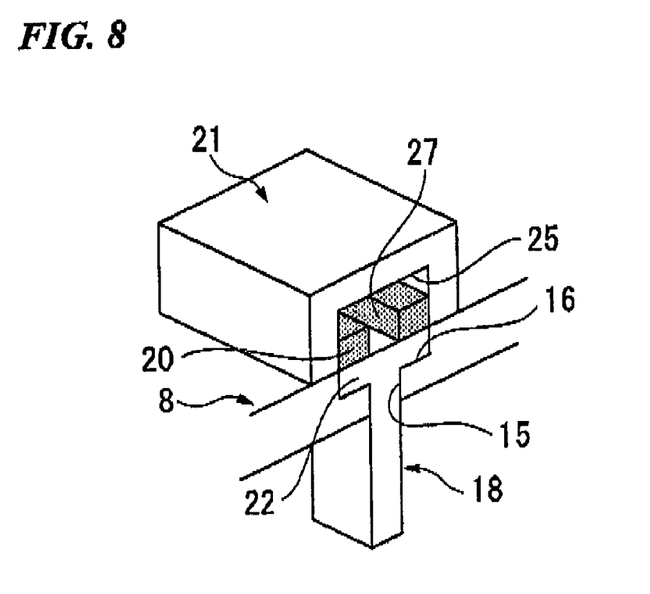
FIG. 8 is a perspective view showing the slide portion being located in the substrate securing position in the upper side of the substrate securing mechanism of FIG. 6.
Figure 9:
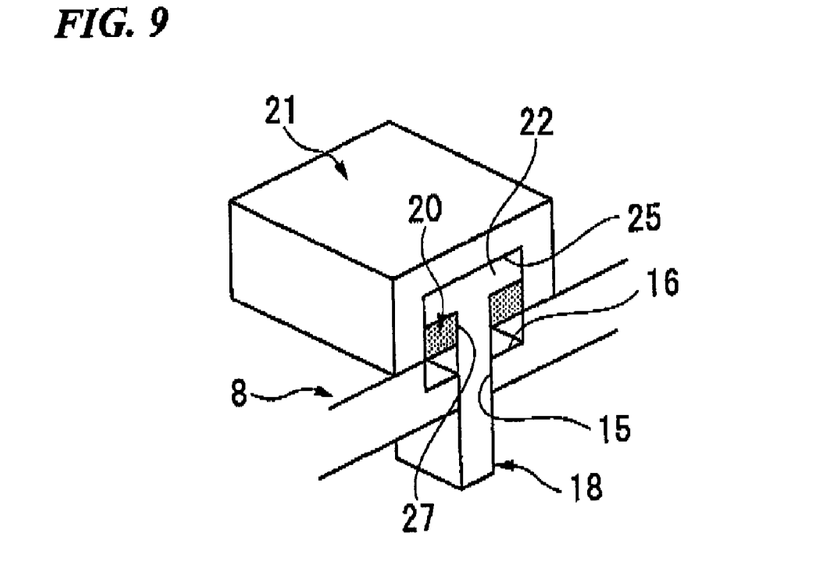
FIG. 9 is a perspective view showing the slide portion being located in the substrate securing releasing position in the upper side of the substrate securing mechanism of FIG. 6.
Figure 10:
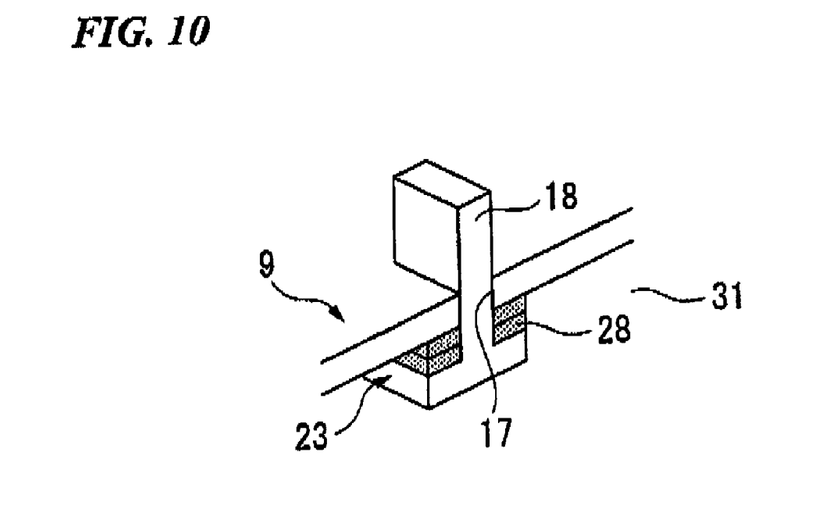
FIG. 10 is a perspective view showing the slide portion being located in the substrate securing releasing position in the lower side of the substrate securing mechanism of FIG. 7.
Figure 11A:
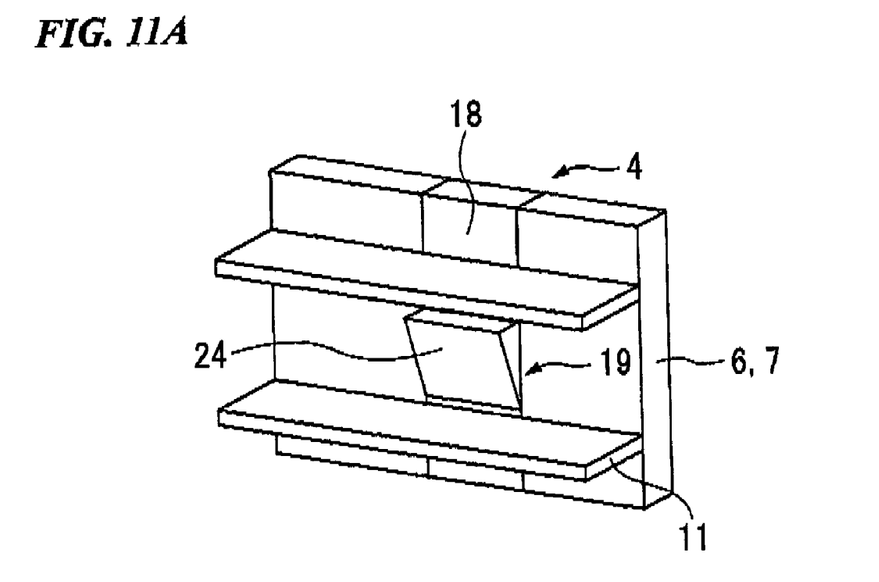
FIG. 11 is a perspective view showing the substrate being secured by the substrate securing mechanism in the substrate housing container of FIG. 1.
Figure 11B:
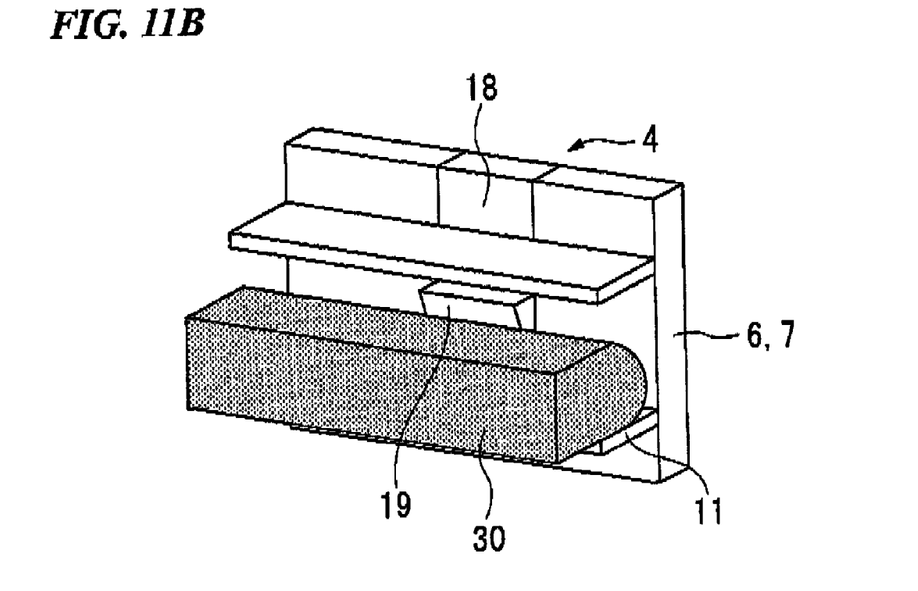
Figure 12A:
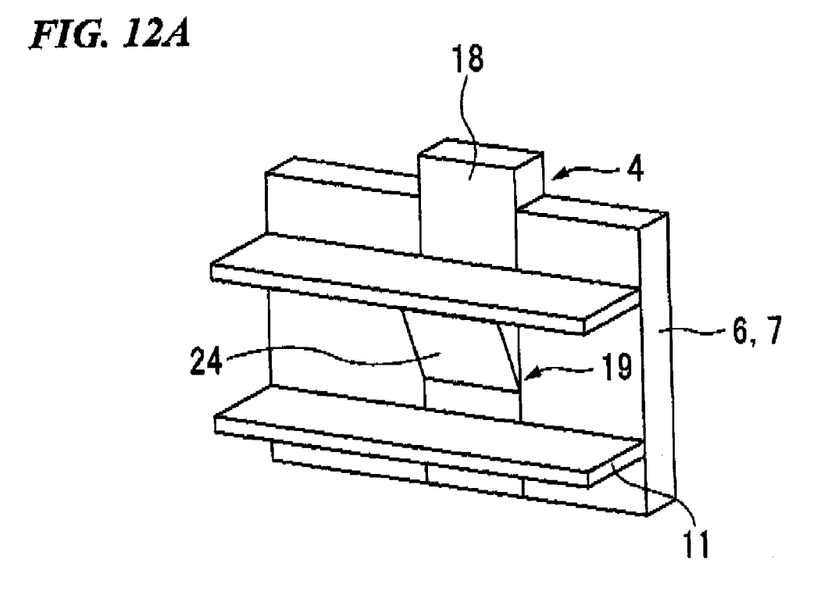
FIG. 12 is a perspective view showing securing of the substrate by the substrate securing mechanism being released in the substrate housing container of FIG. 1.
Figure 12B:
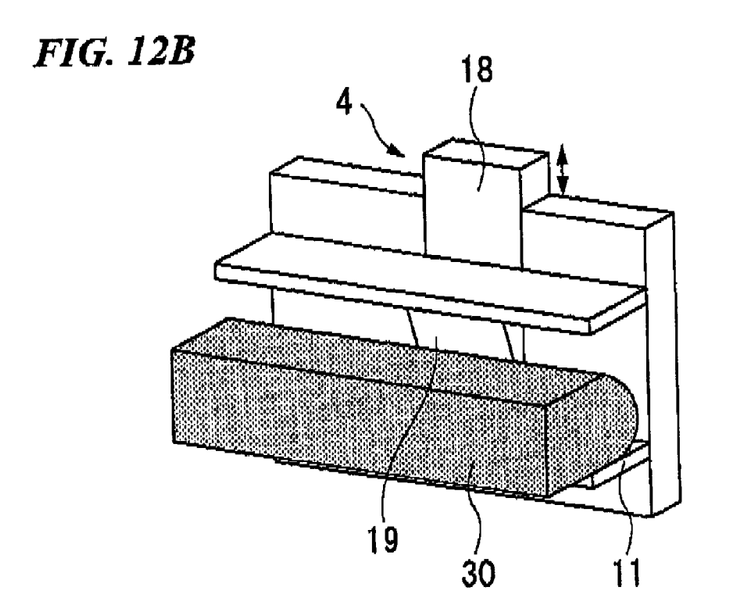
Figure 13A:
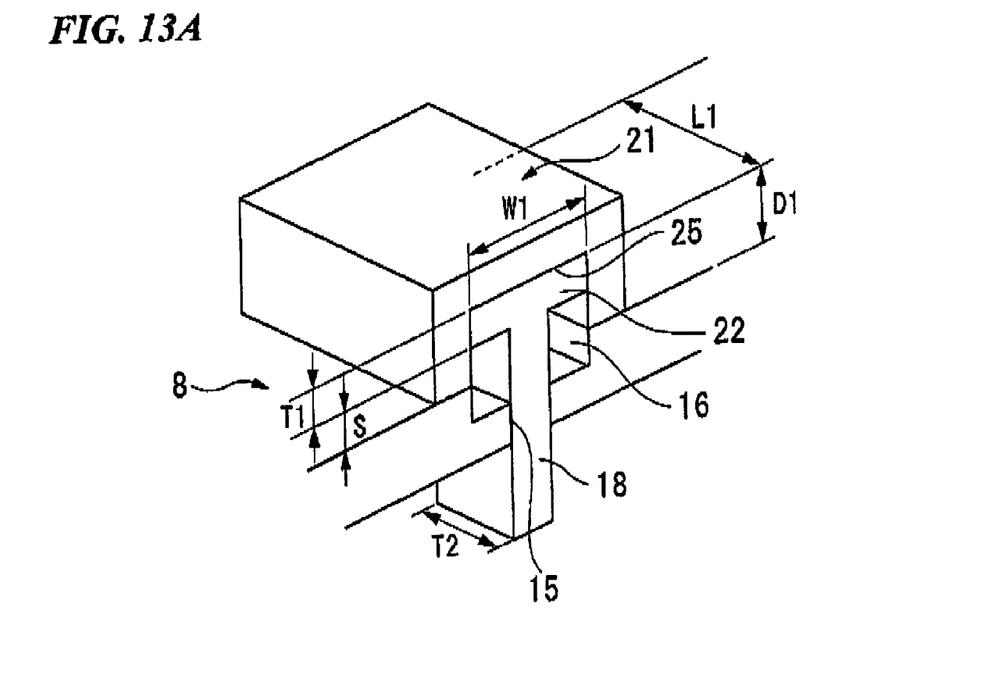
FIG. 13 is a perspective view showing a stopper being located in a slide portion securing releasing position in the upper side of the substrate securing mechanism of FIG. 6.
Figure 13B:
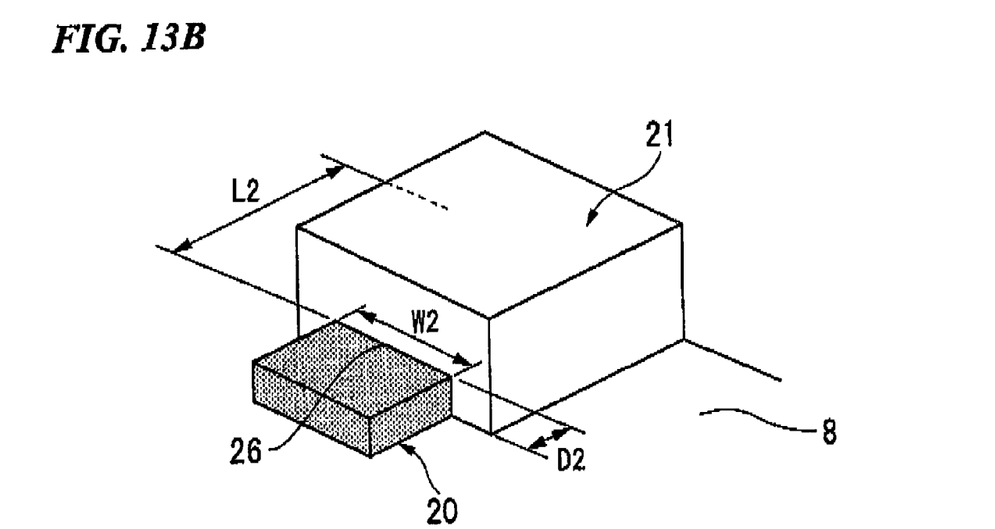

Hereinbelow, a substrate housing container of the present invention shall be described in detail with reference to drawings. FIG. 1 is a perspective view showing an embodiment of a substrate housing container of the present invention. FIG. 2 is a schematic view showing a slide portion being located in a substrate securing position in the substrate housing container of FIG. 1. FIG. 3 is a schematic view showing a state in which a slide portion is located in a substrate securing releasing position in the substrate housing container of FIG. 1. FIG. 4 is a schematic view showing a lid body provided in the substrate housing container of FIG. 1. FIG. 5 is a schematic view showing a slide portion provided in the substrate housing container of FIG. 1. FIG. 6 is an exploded perspective view showing an upper side of a substrate securing mechanism provided in the substrate housing container of FIG. 1. FIG. 7 is an exploded perspective view showing a lower side of a substrate securing mechanism provided in the substrate housing container of FIG. 1. FIG. 8 is a perspective view showing a state in which the slide portion is located in the substrate securing position in the upper side of the substrate securing mechanism of FIG. 6. FIG. 9 is a perspective view showing a state in which the slide portion is located in the substrate securing releasing position in the upper side of the substrate securing mechanism of FIG. 6. FIG. 10 is a perspective view showing a state the slide portion being located in the substrate securing releasing position in the lower side of the substrate securing mechanism of FIG. 7. FIG. 11 is a perspective view showing the substrate being secured by the substrate securing mechanism in the substrate housing container of FIG. 1. FIG. 12 is a perspective view showing securing of the substrate by the substrate securing mechanism being released in the substrate housing container of FIG. 1. FIG. 13 is a perspective view showing a state in which a stopper is located in a slide portion securing releasing position in the upper side of the substrate securing mechanism of FIG. 6. Here, in FIGS. 2 to 5, (a) is a perspective view seen from the direction of arrow A in FIG. 1, (b) is a schematic view seen from a direction perpendicular to the direction of arrow A in FIG. 1.

As shown in FIG. 1, the substrate housing container in accordance with the present embodiment is provided with a main case 1 (wafer case) with a front side thereof open and a lid body 2 for opening and closing the front side of the main case 1 which is opened.

As shown in FIGS. 2 and 3, the main case 1 is constituted so that a plurality of substrates 30 can be housed with intervals.

As a substrate 30, anything with a supporting plate shape is available and so it is not limited but specific examples thereof include a semiconductor wafer and a glass wafer.

The main case 1 is provided with a substrate housing portion 3 and a substrate securing mechanism 4 for securing the substrate 30 housed in the substrate housing portion 3 in a predetermined position.

The substrate housing portion 3 is a substantially rectangular solid shaped chassis with a front side thereof opened. The chassis is composed of a first side wall portion 5 facing the front side, a second and a third side wall portion facing each other and adjacent to the first side wall portion 5, a ceiling portion 8 a lower surface of which is joined to an upper edge portions of the first side wall portion 5 to the third side wall portion 7, and a bottom portion 9 an upper surface of which is joined to a lower edge surfaces of the first side wall portion 5 to the third side wall portion 7. A gasket 10 is provided on an edge surface on a side of the opening of the substrate housing portion 3. The lid body 2 is installed in the substrate housing portion 3 via the gasket 10.

A material for the substrate housing portion 3 is not limited but, for example, thermoplastic polymer elastic body (plastic), such as thermoplastic elastomer (TPF), or the like can be used.

A material for the gasket 10 is not limited but, for example, plastic, such as polycarbonate, or the like can be used.

On the inner surface of the second side wall portion 6 and the third side wall portion 7, a plurality of wafer slots (supporting plate) 11 is arrayed in a vertical direction with predetermined intervals so that the main surfaces thereof are substantially parallel. Each substrate 30 is housed between each of the wafer slots 11 arrayed vertically, and each of the substrates 30 is supported by the wafer slots 11 and bridge the wafer slots 11 located below.

On the second side wall portion 6 and the third side wall portion 7, a slit portion 12 is provided in an extended manner in a direction substantially perpendicular to the direction of the main surface of the wafer slots 11. An upper edge portion and a lower edge portion of the slit portion 12 are open facing the upper edge surface and the lower edge surface of the second side wall portion 6 and the third side wall portion 7. A slide portion (inner side case) 18 of the substrate securing mechanism 4, which will be described later, is movably provided in a vertical direction in the slit portion 12.

As shown in (b) in FIG. 2 and (b) in FIG. 3, on the inner surface of the first side wall portion 5, a substrate securing jig 13a for engaging with the circumferential portion of the substrate 30 supported by each of the wafer slots 11 is plurally arrayed in the vertical direction with substantially the same intervals as each of the wafer sots 11. As shown in (b) in FIG. 4, on a surface on the side of the main case 1 of the lid body 2, a substrate securing jig 13b for engaging with the circumferential portion of the substrate 30 supported by each of the wafer slots 11 is plurally arrayed in the vertical direction to correspond to the plurality of the substrate securing jig 13a.

Each of the substrate securing jigs 13a and 13b have grooves whose cross section is a lateral V shape. Circumferential portions of a rear surface side and a front side of the substrate 30 supported by each of the wafer slots 11 are engaged with the grooves of the substrate securing jigs 13a and 13b and clipped by the substrate securing jigs 13a and 13b when the lid body 2 is installed to the main case 1. Accordingly, the substrate 30 is secured to a predetermined position (a state in which the substrate 30 is supported by the wafer slots below) in the main case 1.

A material for each of the substrate securing jigs 13 is not limited but, for example, the same materials used for the gasket 10 can be used.

As shown in FIG. 6, on the outer edge portion of the ceiling portion 8, a notch portion 15 having substantially the same cross section as the slit portion 12 is provided in the position corresponding to the slit portions 12 formed in each of the second side wall portion 6 and the third side wall portion 7. On the upper surface of the ceiling portion 8, a concave portion 16 of substantially rectangular shape is provided in the position corresponding to the notch portion 15. One side of the concave portion 16 is opened facing the end surface of the ceiling portion 8 and an upper end portion of the notch portion 15 is opened at substantially the center of the bottom portion of the concave portion 16. In the notch portion 15 and the concave portion 16, an upper end portion of a slide portion 18 and an upper flange portion 22, which will be described later, of the substrate securing mechanism 4 are disposed.

As shown in FIG. 7, on the outer edge portion of the bottom portion 9, a notch portion 17 having substantially the same cross section as the slit portion 12 is provided in the position corresponding to the slit portion 12 formed in each of the second side wall portion 6 and the third side wall portion 7. In the notch portion 17, a lower end portion of the slide portion 18, which will be described later, provided in the substrate securing mechanism, is disposed.

As shown in FIGS. 5 to 13, the substrate securing mechanism 4 has a pair of long plate shaped slide portions 18, a plurality of substrate securing pieces 19 provided on one surface of the each of the slide portions 18, a pair of stoppers 20 for securing each of the slide portions 18 at a predetermined height, and a pair of protection covers 21 for covering an upper end portion of the slide portion 18 and an upper flange portion 22, which will be described later.

One of the slide portions 18 is disposed in movable manner in a vertical direction in the notch portion 15 of the ceiling portion 8, the slit portion 12 of the second side wall portion 6, and the notch portion 17 of the bottom portion 9, and the other of the slide portion 18 is disposed in a movable manner in a vertical direction in the notch portion 15 of the ceiling portion 8, the slit portion 12 of the third side wall portion 7 and the notch portion 17 of the bottom portion 9.

Each of the slide portions 18 is constituted such that the length L of which are longer than the height H (a sum of vertical length of the second side wall portion 6 and the third side wall portion 7 and the thickness of the ceiling portion 8 and the bottom portion 9) of the substrate housing portion 3. At least the upper end portion or the lower end portion of the slide portion 18 is protruded from the upper surface of the ceiling portion 8 or the lower surface of the bottom portion 9.

On the upper end portion and the lower end portion of each of the slide portions 18, an upper side flange portion 22 and a lower side flange portion 23 are provided so as to protrude from each of the side surfaces. The upper end portion, the lower end portion of each of the slide portions 18, and the flange portions 22 and 23 make the cross sections of each of the slide portions 18 with a substantially T shape.

As shown in FIG. 2, when the slide portion 18 is slid downward, as shown in FIG. 8, the upper flange portion 22 is firmly inserted in the concave portion 16, and the lower surface of the upper flange portion 22 abuts the bottom surface (outer surface of the ceiling portion 8) of the concave portion 16. Accordingly, the slide portion 18 is restrained from moving further downward. On the other hand, as shown in FIG. 3, when the slide portion 18 is slid upward, as shown in FIG. 9, the upper end portion of the slide portion 18 is protruded from the upper surface of the ceiling portion 8. As shown in FIG. 10, the upper surface of the lower flange portion 23 abuts the lower surface of the bottom portion 9. Accordingly, the slide portion 18 is restrained from moving further upward. That is, the flange portions 22 and 23 function in order to control the height position of the slide portion 18.

In the following descriptions, as shown in FIG. 8, the height position of the slide portion 18, when the lower surface of the upper flange portion 22 abuts the bottom surface of the concave portion 16, is called a "substrate securing position". As shown in FIG. 10, the height position of the slide portion 18, when the upper surface of the lower flange portion 23 abuts the lower surface of the bottom portion 9, is called a "substrate securing releasing position".

A sliding amount (a slidable length) of the slide portion 18 is the difference between a length L of the slide portion 18 and a height H of the substrate housing portion 3 (a sum of lengths of the second side wall portion 6 and the third side wall portion 7 and the thicknesses of the ceiling portion 8 and the bottom portion 9). In this embodiment, the sliding amount is set as the difference of the interval between the wafer slots 11 arrayed vertically and the thickness of the substrate 30, that is, the interval between the wafer slots 11 arrayed vertically (10 mm for example) minus the thickness of the substrate 3 (1 mm for example) equals sliding amount of the slide portion 18 (9 mm for example).

A material for the slide portion 18 is not limited but, for example, the same materials used for the substrate housing portion 3 can be used.

As shown in FIG. 7, a gasket 28 made of plastic such as polycarbonate is provided at least one of a surface (upper surface) facing the bottom portion 9 of the lower flange portion 23, or a surface facing the lower flange portion 23 of the bottom portion 9. Accordingly, it is possible to prevent foreign materials such as dust from entering from a gap between the notch portion 17 of the bottom portion 9 and the slide portion 18, and to prevent the inside of the main case 1 from being polluted.

As shown in FIG. 5, on the inner surface of each of the slide portions 18, a plurality of substrate securing pieces 19 is arrayed in the vertical direction with substantially the same intervals as the wafer slots 11.

As shown in FIGS. 11 and 12, each of the substrate securing pieces 19 is constituted such that surfaces of each of the substrate securing piece 19 facing each of the substrate securing pieces 19 provided on the other slide portion 18 are inclined surfaces 24 which are inclined so as to be closer to the inner surface of the slide portion 18 at the more downward sections thereof.

These substrate securing pieces 19 press the circumferential portion of the substrate 30, which is supported above the wafer slot 11, to the wafer slot 11 by the inclined surface 24 abutting the circumferential portion of the substrate 30 as shown in (b) of FIG. 11 when the slide portion 18 is located in the substrate securing position (a height position in a state in which the lower surface of the upper flange portion 22 abuts the bottom surface of the concave portion 16). Accordingly, the substrate 30 is in a state of being secured above the wafer slot 11.

In this state the lid body 2 is not installed. Even when the securing by the substrate securing jig 13 is released, the substrate 30 is secured on the wafer slot by the substrate securing pieces 19. Therefore, even when the main case is subject to vibration, the substrate 30 is held on the wafer slot 11.

On the other hand, when the slide portion 18 is slid above the substrate securing position, as shown in (b) of FIG. 12, the substrate securing piece 19 moves above accordingly and moves apart from the circumferential portion of the substrate 30. Accordingly, the securing state of the substrate 30 is released.

Here, the sliding of the slide portion 18 upward can be performed by, for example, placing the main case 1 onto a base platform by abutting the lower flange portion 23 to a base platform surface and moving the substrate housing portion 3 relatively downward with respect to the slide portion 18 (the slide portion 18 is pushed upward with respect to the substrate housing portion 3). The sliding of the slide portion 18 downward can be performed by, for example, picking up the main case 1 from the base platform surface and moving the slide portion 18 relatively downward with respect to the substrate housing portion 3 by its own weight. Accordingly, by picking up the substrate housing container from or placing down the substrate housing container 3 on the base platform, it is possible to switch between the securing releasing state and securing state of the substrate 30 without moving the slide.

A material for the substrate securing piece 19 is not limited but, for example, the same materials used for the gasket 10 can be used.

As shown in FIG. 6, a protection cover 21 with square shaped cross section is provided on the upper surface of the ceiling portion 8 so as to cover the upper end portion of the slide portion 18 and the upper flange portion 22.

As shown in FIG. 13, a first groove 25 and a second groove 26 are provided on an inner top portion of the protection cover 21.

The first groove 25 is provided on the side of the outer edge of the substrate housing portion 3, the depth D1 as shown in FIG. 13 is substantially the same as the sum of the difference S between the length L of the slide portion 18 and the height H of the substrate housing portion 3, and the thickness T1 of the upper flange portion 22. The length (depth) L1 is substantially the same as the thickness T2 (a length in a direction perpendicular to the inner surface) of the slide portion 18. The width W1 is substantially the same as a width W of the upper flange portion 22. In the second groove 26, the depth D2 is substantially the same as the difference S between the length L of the slide portion 18 and the height H of the substrate housing portion 3, and the width W2 is substantially the same as the width W of the upper flange portion 22.

In the first groove 25 of the protection cover 21, the upper end portion of the slide portion 18 and the upper flange portion 22 are housed. Accordingly, it is possible to prevent foreign materials such as dust from entering from a gap between the notch portion 15 provided in the ceiling portion 8 and the slide portion 18, and to prevent the substrate housing portion from being polluted.

In the first and second grooves 25 and 26 of the protection cover 21, the stopper 20 is movably arrayed along the extending direction of the grooves.

As shown in FIG. 13, the stopper 20 is shaped as a small piece, and the thickness of which is substantially the same as the depth D2 of the second groove 26 in the protection cover 21, the length of which is substantially the same as the sum of the length L1 of the first groove 25 and the length L2 of the second groove 26, and the width of which is substantially the same as the widths of the first groove W1 and the second groove W2. On the outer edge of the stopper 20, a notch portion 27 having substantially the same cross section as the slit portion 12 is provided.

The stopper 20 can be used for securing the slide portion 18 in the substrate securing releasing position or the substrate securing position.

That is, as shown in FIG. 13, in the initial state, the stopper 20 is moved to the opposite side from the side of the outer edge of the substrate housing portion 3, and the notch portion 27 is housed in the side of the second groove 26.

As shown in FIG. 9, the slide portion 18 is moved upward to the substrate securing releasing position, when the stopper 20 is moved to the side of the outer edge of the substrate housing portion 3, the notch portion 27 of the stopper 20 moves to the side of the first groove 25, and the upper end portion of the slide portion 18 enters in the notch portion 27. At this moment, the lower surface of the upper flange portion 22 abuts the upper surface of the stopper 20, and according to the state, the slide portion 18 is restrained from moving downward further and so the slide portion 18 is secured in the substrate securing releasing position. That is, by inserting the stopper 20 between the upper flange portion 22 and the ceiling portion 8, it is possible to secure the slide portion 18 in the state of being moved upward.

On the other hand, as shown in FIG. 8, the slide portion 18 is moved downward to the substrate securing position, when the stopper 20 is moved to the side of the outer edge of the substrate housing portion 3, the notch portion 27 of the stopper 20 moves to the side of the first groove 25, and the upper surface of the upper flange portion 22 abuts the lower surface of the notch portion 27. Accordingly, the slide portion 18 is restrained from moving further upward and so the slide portion 18 is secured in the substrate securing position.

In the following descriptions, a position in which the stopper 20 and the notch portion 27 are in the first groove 25 is named a "slide portion securing position" and a position in which the stopper 20 and the notch portion 27 are in the second groove 26 is named "slide portion securing releasing position".

A material for the stopper portion 20 is not limited but, for example, the same materials used for the substrate housing portion can be used.

As shown in FIG. 1, the lid body 2 is detachably installed to the main case 1 and the opening is opened or closed by the lid body 2.

As shown in FIG. 4, as described above, a plurality of substrate securing jigs 13 is arrayed in a vertical direction in the lid body 2 on the surface of the side of the main case 1. The substrate 30 housed in the main case 1 is clipped by the substrate securing jig 13 and the substrate securing jig 13 provided on the first side wall portion 5, in a state in which the lid body 2 is installed in the main case 1, and the substrate 30 is secured in a predetermined position (a state of being supported by the wafer slots below) in the main case 1.

A material for the lid body 2 is not limited but, for example, the same materials used for the substrate housing portion 3 can be used.

Next, an example of usage of the substrate housing container shall be described.

Here, a case, in which the substrate housing container housing the substrates 30 is lifted and transferred from a state of being placed on the operation desk 31, and placed on the other operation desk 31, and the substrates 30 are taken out from the substrate housing container, shall be described.

As shown in FIG. 10, in the substrate housing container placed on the operation desk 31, the lower surface of the lower flange portion 23 abuts the upper surface of the operation desk 31, and the upper surface of the lower flange portion 23 abuts the bottom portion 9 of the substrate housing portion 3. The upper end portion of the slide portion 18 is in a state of being protruded from the upper surface of the ceiling portion 8 of the substrate housing portion 3. That is, the slide portion 18 is in the substrate securing releasing position. At this moment, as shown in FIG. 12, the substrate securing piece 19 is apart from the circumferential portion of the substrate 3, and is located above the circumferential portion of the substrate 3, and the securing of the substrate 30 is released.

Here, the stopper 20 may be located in the slide portion securing releasing position or may be moved to the slide portion securing position. The lid body 2 may be installed to the main case 2 or may be released from the main case 1.

Next, in a case in which the stopper 20 is located in the slide portion securing position, the stopper 20 is moved to the slide portion securing releasing position. The main case 1 is lifted from a state of being on the operation desk 31. Accordingly, the slide portion 18 moves relatively downward with respect to the substrate housing portion 3 by the weight thereof. As a result, as shown in FIG. 2, the lower end portion of the slide portion 18 is protruded from the lower surface of the bottom portion 9, the upper flange portion 22 is firmly inserted in the concave portion 16, and the lower surface of the upper flange portion 22 and the bottom surface of the concave portion 16 abut (substrate securing position). At this moment, the substrate securing piece 19 moves downward in accordance with the downward movement of the slide portion 18, the inclined surface of the substrate securing piece 19 abuts the circumferential portion of the substrate 30. Accordingly, as shown in (b) in FIG. 11, the circumferential portion of the substrate 30 is pressed against the wafer slot 11; and the substrate 30 is secured on the wafer slot 11.

In this state, the substrate housing container is moved to the other operation desk. At this time, the substrate housing container is subjected to vibration, since the substrate 30 is secured on the wafer slot 11 by the substrate securing piece 19, even when the lid body 2 is not installed or the securing by substrate securing jig 13 is released due to the lid body being released during transportation, the substrate 30 is held on the wafer slot 11. Accordingly, the substrate 30 is prevented from being damaged or broken due to hitting with another substrate 30 or the inner surface of the main case 1, and so it is possible to transport the substrate housing container safely.

Next, the substrate housing container is placed on the other operation desk. Accordingly, the lower surface of the lower flange portion 23 abuts the upper surface of the operation desk, and the substrate housing portion 3 moves relatively downward with respect to the slide portion 18 by the weight thereof and the weight of the substrate 30 housed therein, and the lower surface of the bottom portion thereof abuts the upper surface of the lower flange portion 23. As shown in FIG. 3, the slide portion 18 is moved upward with respect to the substrate housing portion 3, the upper flange portion 22 is moved to above the concave portion 16, and the upper end portion of the slide portion 18 is protruded (the substrate securing releasing position) from the upper surface of the ceiling portion 8 of the substrate housing portion 3. At this moment, the substrate securing piece 19 is moved upward in accordance with the slide portion 18 being moved upward, and the inclined surface of the substrate securing piece 19 moved apart from the circumferential portion of the substrate 30. Accordingly, as shown in FIG. 12, the securing of the substrate 30 is released. With this state, it is possible to take out the substrate 30 from the main case 1.

In the above described operational sequences, before transforming the substrate housing container, in a state in which the slide portion 18 is located in the substrate securing position, the stopper 20 may be moved to the slide portion securing position. Accordingly, when the substrate housing container is transformed, the slide portion 18 is reliably secured to the substrate securing position, and it is possible to reliably maintain the state in which the substrate 30 is secured.

In a state in which the slide portion 18 is in the substrate securing releasing position, the stopper 20 is moved to the slide portion securing position in advance, with this state, the substrate housing container may be transported. Accordingly, it is possible to take out and bring in the substrate 30 during the transportation of the substrate housing container.

Next, in a case of using the substrate housing container having the above described constitution, an example of using the stopper 20 differently in accordance with the purpose of use shall be supplementarily described with reference to the flow chart.

Figure 14:
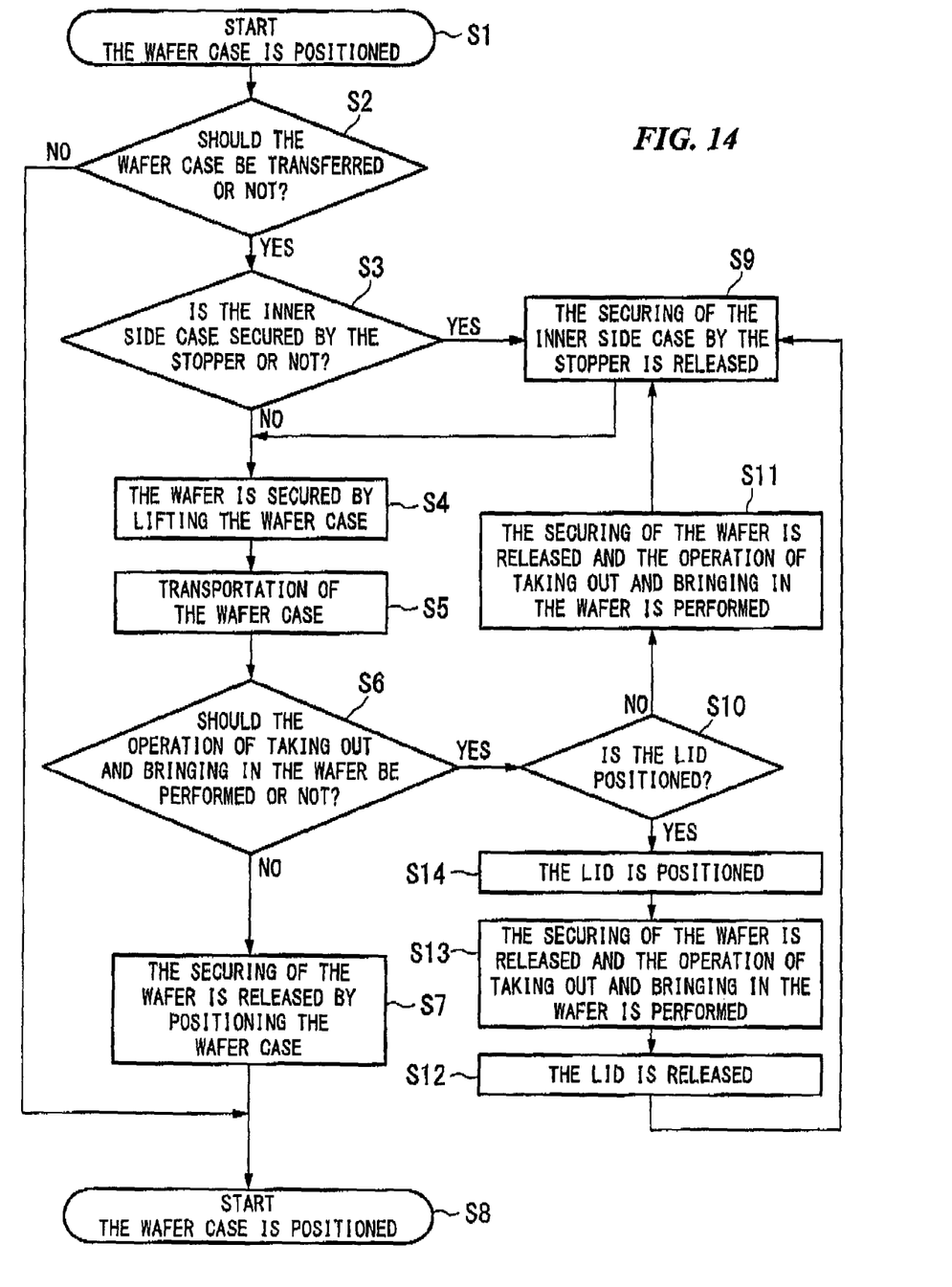
FIG. 14 is a flow chart showing a pattern of how the substrate housing container should be treated in accordance with the state of the stopper.

FIG. 14 systematically shows an example of usage pattern in accordance with the different usage of the stopper 20. In step S1, the substrate housing container (wafer case) is placed in a predetermined position, in step S2, the wafer case is determined to be moved, and in step S3, the stopper 20 is used to check whether the slide portion (inner side case) 18 is secured or not. When the slide portion 18 is not secured, the sequence proceeds to step S4 and the main case (wafer case) is lifted and the wafer is secured, in step S5, the main case is moved to a target position, and in step S6, it is determined whether the operation of bringing in and taking out the wafer is performed. When the main case is lifted, the slide portion moved downward by the weight thereof and the inclined surface of the substrate securing piece 19 presses the wafer, it is possible to secure the wafer during the transportation operation.

When the operation of bringing in and taking out the wafer is not performed in step S6, the sequence went back to a state in which the main case is placed in step S7, and restarts the sequence in step S7.

In step S3, when the slide portion (inner side case) 18 is secured by the stopper 20, the sequence jumps to step S9 and securing of the slide portion (inner side case) 18 is released by the stopper and the sequence moves to step S4.

In step S6, when the operation of bringing in and taking out the wafer is determined to be performed in step S6, the sequence jumps to step S10, and in step S10, it is determined whether the substrate housing container should be closed by a lid body (lid) or not. When the substrate housing container is determined not to be closed, in step S11, the securing of the wafer is released and the operation of bringing in and taking out the wafer is performed, and the sequence moves to step S9.

In step S10, when the substrate housing container is confirmed to be closed by the lid body, the sequence moves to step S12 and release the lid body, and moves to step S13 and releases the securing of the wafer to perform the operation of bringing in and taking out of the wafer. When the operation is over in step S13, in step S14, the substrate housing container is closed by the lid body and the sequence goes back to step S9.

Here, a series of transportation embodiment of the wafer in accordance with the steps S1 to S14 described above is only an example of the usage of the substrate housing container. Therefore, the transportation embodiment of the wafer using the substrate housing container is not limited to the example shown in FIG. 14.

Specific embodiments of the substrate housing container in accordance with the present invention were described above. However, shapes and constitutional materials of each portions of the substrate housing container is merely an example and so various changes and modification are possible based on design requirements and the like, provided they do not depart from the gist of the present invention.

As application examples of the present invention, substrate housing container used for housing, storing, transportation and the like of the semiconductor wafer, glass wafer, and the like is quoted.

What is claimed is:

1. A substrate housing container comprising:
   a substrate housing portion of chassis shaped having a ceiling portion, a bottom portion, and a plurality of side wall portions,
   a plurality of supporting plates arrayed with intervals between main surfaces from the side of the ceiling portion to the side of the bottom portion on the inner surface of the pair of side wall portions which configures the substrate housing portion,
   slit portions formed in each of the pair of side wall portions in an extended manner along the array direction of the supporting plates,
   a slide portion movably arrayed in the slit portions and an edge portion of the slide portion is protruded from at least the ceiling portion or the bottom portion, and
   a substrate securing piece parallely arrayed with substantially the same intervals as the intervals of the supporting plates on the inner surface of the slide portion,
   wherein a substrate housed in the substrate housing portion is freely placed between the supporting plate provided on one of the pair of side wall portions and the other of the pair of the side wall portions as if bridged therebetween,
   the substrate is freely secured on the supporting plates with the substrate securing piece abutting the circumferential portion of the substrate in a state in which one end portion of the slide portion is protruded from the bottom portion,
   a substrate securing state is freely released with the substrate securing piece moving apart from the circumferential portion of the substrate in which the other end portion of the side portion is protruded from the ceiling portion.

2. The substrate housing container in accordance with claim 1, further comprising:
   an upper flange portion located in the outer side of the substrate housing container provided on the edge portion on the side of the ceiling portion of the slide portion so that the downward movement of the slide portion is restrained in a state in which the upper flange portion abuts the ceiling portion.

3. The substrate housing container in accordance with claim 2, wherein
   the substrate securing piece may be freely secured with the substrate securing piece abutting the circumferential portion of the substrate and pressing the substrate to the supporting plate in which the upper flange portion abuts the ceiling portion.

4. The substrate housing container in accordance with claim 1, further comprising:
   a lower flange portion located in the outer side of the substrate housing container provided in the edge portion of the side of the bottom portion of the slide portion so that the upward movement of the slide portion is restrained in which the lower flange portion abuts the bottom portion.

5. The substrate housing container in accordance with claim 4, wherein
   the substrate securing piece moves apart from the circumferential portion of the substrate and the securing state of the substrate is freely releasable in which the lower flange portion abuts the bottom portion.

6. The substrate housing container in accordance with claim 4, further comprising:
   a gasket provided at least in either a surface facing the bottom portion of the lower flange portion or a surface facing the lower flange portion of the bottom portion.

7. The substrate housing container in accordance with claim 2, Her comprising:
   a stopper provided for securing the slide portion so that at least the upper flange portion abuts the ceiling portion or the lower flange portion abuts the side of the bottom portion.

8. The substrate housing container in accordance with claim 7, wherein
   the stopper can be freely inserted between the upper flange portion and the ceiling portion, and the slide portion can be freely temporally secured by the stopper in a state in which the upper flange portion of the slide portion protruding from the ceiling portion.

9. The substrate housing container in accordance with claim 2, further comprising:
   a protection cover for covering the upper edge portion of the slide portion and the upper flange portion provided in the ceiling portion.

10. The substrate housing container in accordance with claim 2, further comprising:
    an opening on a surface of one side of an outer side case,
    a lid body for opening and closing the opening,
    a plurality of substrate securing jigs for engaging with the circumferential portion of the substrate placed on the supporting plates on the inner surface of the side wall portion facing the opening and the surface on the side of the outer side case of the lid body with substantially the same intervals as the supporting plates, wherein
    when the opening is closed by the lid body, the substrate is clipped with the substrate securing jig provided on the side wall portion and the substrate securing jig provided on the lid body, and
    the substrate is secured on the supporting plate.

* * * * *